(12) United States Patent
Quinones et al.

(10) Patent No.: US 6,989,588 B2
(45) Date of Patent: Jan. 24, 2006

(54) SEMICONDUCTOR DEVICE INCLUDING MOLDED WIRELESS EXPOSED DRAIN PACKAGING

(75) Inventors: Maria C. Y. Quinones, Cebu (PH); Consuelo N. Tangpuz, Lapulapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 293 days.

(21) Appl. No.: 09/963,049

(22) Filed: Sep. 24, 2001

(65) Prior Publication Data

US 2003/0052408 A1 Mar. 20, 2003

Related U.S. Application Data

(63) Continuation-in-part of application No. 09/548,946, filed on Apr. 13, 2000.

(51) Int. Cl.
*H01L 23/02* (2006.01)
*H01L 23/495* (2006.01)

(52) U.S. Cl. .................................. 257/680; 257/666
(58) Field of Classification Search ................ 257/666, 257/680
See application file for complete search history.

(56) References Cited

U.S. PATENT DOCUMENTS

| | | | |
|---|---|---|---|
| 4,897,508 A * | 1/1990 | Mahulikar et al. ......... 174/52.4 |
| 4,935,803 A * | 6/1990 | Kalfus et al. ............... 257/673 |
| 5,319,242 A | 6/1994 | Carney et al. | |
| 5,508,561 A * | 4/1996 | Tago et al. ................. 257/737 |
| 5,530,284 A * | 6/1996 | Bailey ........................ 257/670 |
| 5,637,916 A | 6/1997 | Joshi | |
| 5,765,280 A | 6/1998 | Joshi | |
| 5,789,809 A | 8/1998 | Joshi | |
| 6,133,634 A | 10/2000 | Joshi | |
| 6,249,041 B1 * | 6/2001 | Kasem et al. ............... 257/666 |
| 6,294,403 B1 | 9/2001 | Joshi | |
| 6,391,687 B1 | 5/2002 | Cabahug et al. | |
| 6,423,623 B1 | 7/2002 | Bencuya et al. | |
| 6,469,384 B2 | 10/2002 | Joshi | |
| 6,489,678 B1 | 12/2002 | Joshi | |
| 6,566,749 B1 | 5/2003 | Joshi et al. | |
| 6,617,655 B1 | 9/2003 | Estacio et al. | |
| 6,627,991 B1 | 9/2003 | Joshi | |
| 6,645,791 B2 | 11/2003 | Noquil et al. | |
| 6,646,329 B2 | 11/2003 | Estacio et al. | |
| 6,649,961 B2 | 11/2003 | Estacio et al. | |
| 6,661,082 B1 | 12/2003 | Granada et al. | |
| 6,720,642 B1 | 4/2004 | Joshi et al. | |
| 6,731,003 B2 | 5/2004 | Joshi et al. | |
| 2003/0025183 A1 | 2/2003 | Thornton et al. | |

OTHER PUBLICATIONS

"Application Notes for Surface Mount Assembly of Amkor's Thermally/Electrically Enhanced Leadframe Based Packages;" Mar. 2000; pp. 1–7; Amkor Technology.
Web page; "Amkor Technology: Company News: Press Releases;" at URL=http://www.amkor.com/dbscripts/verity/search_the_website.cfm; printed May 30, 2000; pp. 1–4.
Data Sheet; "ExposedPad™ L/TQFP;" Jun. 2000; 2 pages; Amkor Technology.
Data Sheet; ExposedPad™ TSSOP; Mar. 2001; 2 pages; Amkor Technology.

* cited by examiner

*Primary Examiner*—Howard Weiss
(74) *Attorney, Agent, or Firm*—Townsend and Townsend and Crew, LLP

(57) ABSTRACT

A semiconductor device including a leadframe and a die coupled thereto. A drain pad is coupled to the drain region of the die in a body that substantially envelopes the leadframe and the die. The body includes a window defined therein. The body is placed around the leadframe and the die such that a surface of the drain pad opposite the die is exposed through the window.

13 Claims, 6 Drawing Sheets

SEMICONDUCTOR DEVICE INCLUDING MOLDED WIRELESS EXPOSED DRAIN PACKAGING

CROSS-REFERENCE TO RELATED APPLICATIONS

This is a continuation-in-part application of copending patent application Ser. No. 09/548,946, filed Apr. 13, 2000, which is incorporated herein in its entirety for all purposes.

BACKGROUND OF THE INVENTION

1. Field of the Invention

The present invention relates to semiconductor power switching devices such as power MOSFET devices, and more particularly, to a semiconductor device including molded wireless exposed during packaging and a method of packaging the same.

2. Description of the Prior Art

Semiconductor power switching devices, and particularly, power MOSFET devices, continue to push the lower limits of on-state resistance. While silicon technology has advanced significantly in the past decade, essentially the same decades old package technology continues as the primary packaging means. The epoxy or soldered die attach along with aluminum or gold wire interconnects is still a preferred power device package methodology. Recently, packages have been manufactured by connecting the die within the package to the leads directly through a low resistance solder connection. By using a second leadframe element and solder to connect the package conductors and the first leadframe, a direct connection is enabled. Furthermore, the size and shape of the second leadframe may be tailored to fit the chip device and to minimize its electrical and thermal resistance.

When gold wire bonding is done on a gate connection within a chip, the use of adhesives may introduce resin bleeds that are difficult to control and can interfere with the gate bond contact integrity. When silver-filled adhesives are used on the source and drain connections, since adhesives do not flow selectively, the resulting device is generally more prone to source shorting within the gate or drain. Additionally, adhesives generally have inferior electrical conductivity compared to solders.

Recently, copper straps have been used to couple dies to leads. Generally, with such arrangements, more than 60% of the die area is occupied by the copper strap with adhesives underneath the copper strap. This means less mold plastic is available to securely hold the internal assembly. Since a bigger area is allocated for adhesives, this also means more chances for void formation of the chip device.

Finally, another concern with regard to packaging of semiconductor devices is the elimination of heat generated by the device. Generally, power MOSFET devices can generate a fair amount of heat.

SUMMARY OF THE INVENTION

The present invention provides a semiconductor device including a leadframe and a die coupled to the leadframe. The leadframe includes a source pad and a gate pad and a plurality of leads extending from the source pad and at least one lead extending from the gate pad. The semiconductor device further includes a drain pad coupled to a drain region of the die and a body including a window defined therein. The body substantially envelops the leadframe and die such that a surface of the drain pad opposite the die is exposed through the window.

In accordance with one aspect of the present invention, the drain pad is coupled to the die with soft soldering material.

In accordance with another aspect of the present invention, the drain pad includes a side lip and the semiconductor device further includes a lead rail that includes a plurality of leads. The lead rail is coupled to the drain pad at the side lip.

In accordance with a further aspect of the present invention, the drain pad is coupled to the die with soft soldering material and the lead rail is coupled to the side lip with soft soldering material.

In accordance with yet another aspect of the present invention, the leadframe further includes two tie bars at each end of the leadframe.

The present invention also provides a method of packaging a semiconductor die wherein the method includes providing a leadframe including a source pad and a gate pad and coupling a die to the leadframe. A drain pad is coupled to a drain region of the die and a body including a window defined therein is placed around the leadframe and the die such that the surface of the drain pad opposite the die is exposed through the window and the lead of the leadframe extends through the body.

Thus, the present invention provides an improved chip device and a method of manufacturing it. The process does not require any wire bonding because the drain connections are directly soldered onto the drain pad during solder reflow while the source and gate bumps are directly coupled to the leadframe. The resulting gate connections are more reliable compared to those produced by the gate wire bonding process. Additionally, solder is used for both the source and drain connections, and thus wetting can only happen on the solderable metals making it less probable for gate shorting as both connections are isolated with non-wettable areas. Additionally, solder alloys have better conductivity compared to adhesives, which leads to lower RDSon performance of the chip device.

Finally, because the drain pad is exposed through the body, the chip device has improved heat dissipation.

Other features and advantages of the present invention will be understood upon reading and understanding the detailed description of the preferred exemplary embodiments, found hereinbelow, in conjunction with reference to the drawings, in which like numerals represent like elements.

DESCRIPTION OF SPECIFIC EXEMPLARY EMBODIMENTS

Figure 1:
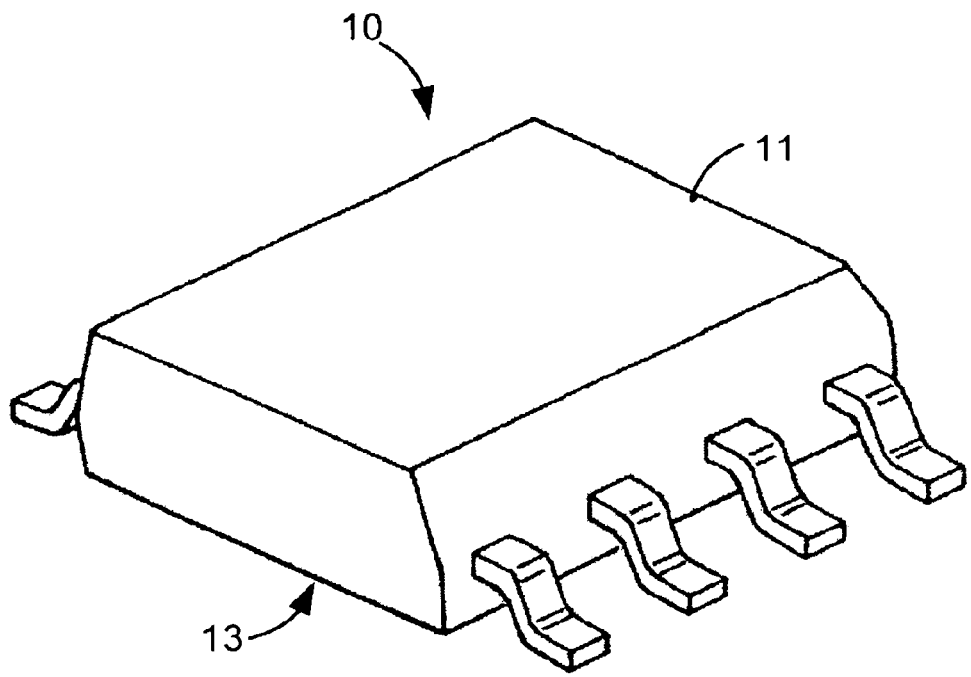
FIG. 1 is a top perspective view of a semiconductor device in accordance with the present invention.
Figure 2:
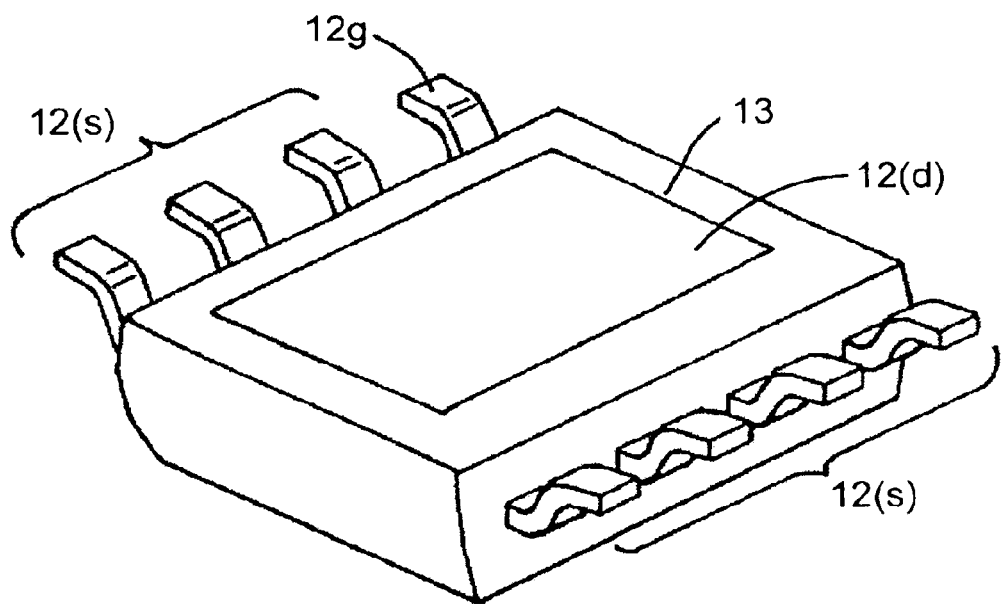
FIG. 2 is a bottom perspective view of the semiconductor device illustrated in FIG. 1.
Figure 5:
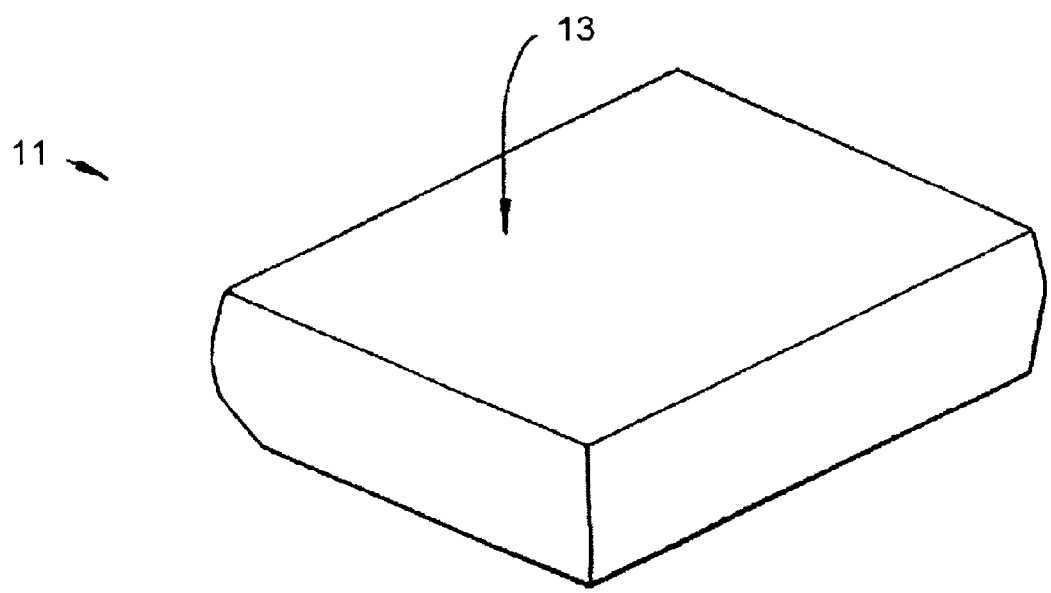
FIG. 5 is a bottom perspective view of a molded body or package for use with a semiconductor device in accordance with the present invention.

FIG. 1 illustrates a semiconductor device 10 that includes a body or package 11 and a plurality of leads 12 including source leads 12s, drain leads 12d, and a gate lead 12g extending therefrom. Preferably the body is a molded two-piece package. As can be seen in FIGS. 2 and 5, the body includes a window 13 defined therein. Preferably, the body comprises thermoset polymers.

Figure 3:
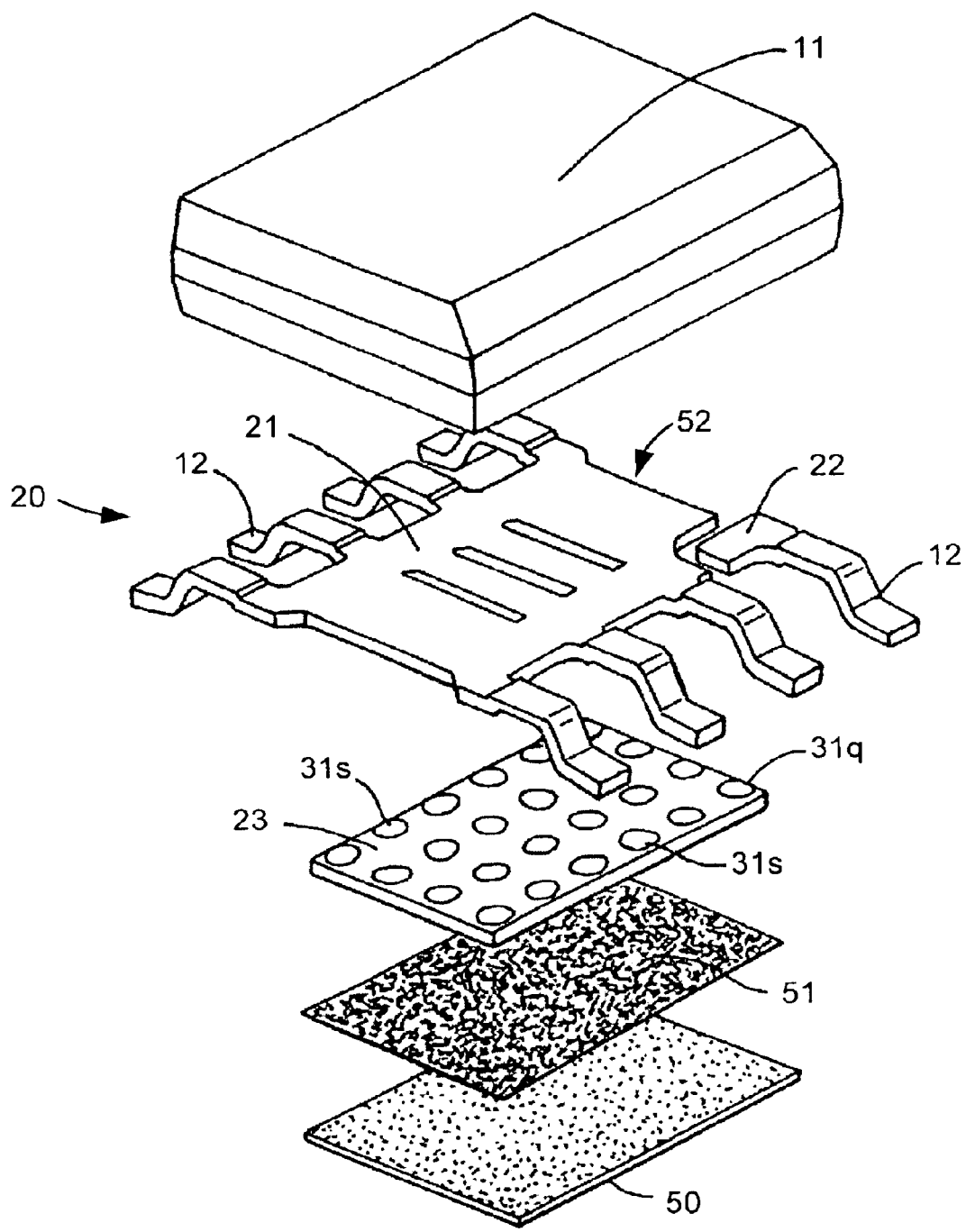
FIG. 3 is an exploded view of the semiconductor device illustrated in FIG. 1.

With reference to FIG. 3, a leadframe 20 is provided. The leadframe includes a source pad 21 and a gate pad 22. A die 23 is also provided for coupling to the leadframe.

Figure 6:
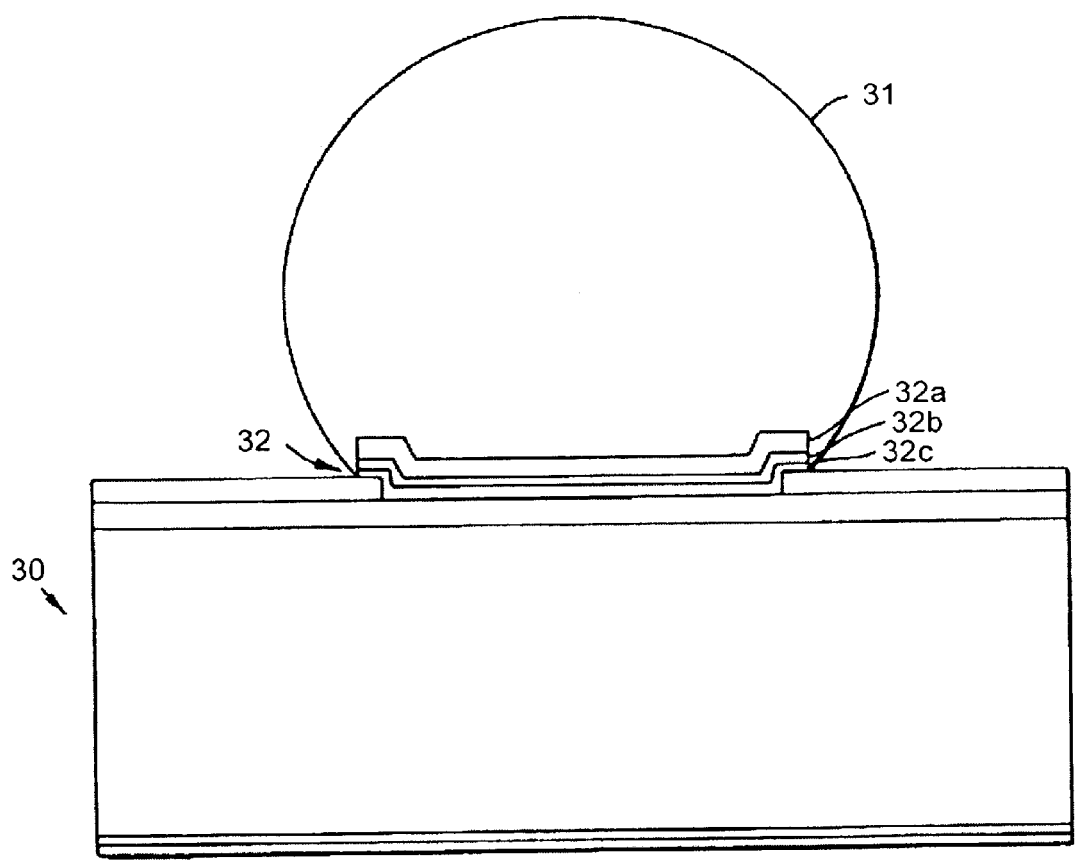
FIG. 6 is a partial side sectional view of a bumped die for use with a semiconductor device in accordance with the present invention.

A packaging arrangement in accordance with the present invention is especially useful in power MOSFET devices. Hence, the die is preferably a power trench silicon die. Furthermore, the die is preferably a one-piece item that is often referred to in the art as a "bumped die." As can be seen in FIG. 6, a bumped die includes the die 30, the solder bumps 31, and under bump material 32 that serves as an intermediate layer between the top surface of the die and the solder bumps. Preferably, the under bump material is one of TiW, Cu, Au or an equivalent. In the example illustrated in FIG. 6, the under bump material is broken into three layers—Cu plating 32a, sputtered Cu32b and sputtered Ti 32c.

The bumped die is preferably flip chip attached on to the leadframe, i.e., it is "flipped" from a sawn tape onto the leadframe. The bumped die is placed on the leadframe such that gate solder bump 31g contacts gate pad 22 on the leadframe while the source solder bumps 31s contact source pad 21 on the leadframe.

Preferably, the leadframe comprises Ni or Ni—Pd plated Cu alloy. Preferably, the solder bump comprises 95Pb/5Sn or Pb-free solder with equivalent melting temperature.

Figure 7:
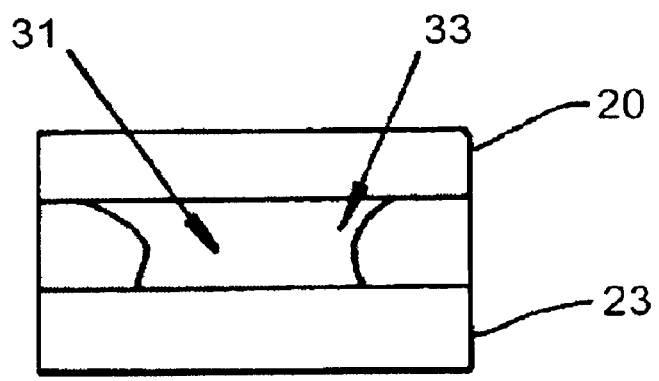
FIG. 7 is an enlarged view of a solder bump between a die and a lead frame in accordance with the present invention.

As can be seen in FIG. 3, a drain clip or drain pad 50 is provided for coupling to the backside of the die. The drain pad provides the drain connection of the semiconductor device and is the primary heatsink of the semiconductor device. It also serves as the die back shield. Preferably, the drain pad comprises Ni or Ni—Pd plated Cu alloy. The drain pad preferably has a thickness of 4–6 mils. The drain pad is preferably coupled to the backside of the die with soft soldering material 51 that binds the die back and drain pad together. The soft soldering material also absorbs compression stresses during molding of the body around the semiconductor device. Preferably the soft soldering material comprises 88Pb10Sn2Ag 85Pb10Sb5Sn, 90Pb10Sb and 82.5Pb15Sn2.5Ag or Pb-free solder with equivalent melting temperature in the preferred soft solder material. The soft soldering material has a lower melting temperature than the solder bumps, thus allowing the soft soldering material to be reflowed without reflowing the solder bumps that have been previously reflowed in order to couple the die to the leadframe. Furthermore, as can be seen in FIG. 7, the solder bumps on die 23 are not "collapsed" between leadframe 20 and die 23. Soft solder 33 may also be placed between the solder bump 31 and leadframe to help bind the solder bump thereto.

As can be seen in FIG. 3, the leadframe includes free slots 52. The free slots help prevent molding voids.

Because the drain pad is coupled to the backside of the die, preferably the die backside includes a backmetal that promotes drain conductivity and helps serve as the only Ohmic contact between the silicon substrate and the drain pad. Preferably, the back metal comprises Au-flashed Ti—Ni—Ag back metal or an equivalent.

Once the drain pad has been coupled to the die, the body is placed around the leadframe, die and drain pad in order to protect and complete the semiconductor device. As can be seen in FIG. 5, the body includes window 13 defined therein so that the drain pad is exposed.

When using the completed semiconductor device, the drain pad serves as the drain connection while the leads serve as the source connections. Gate lead 60 serves as the gate connections.

Figure 4:
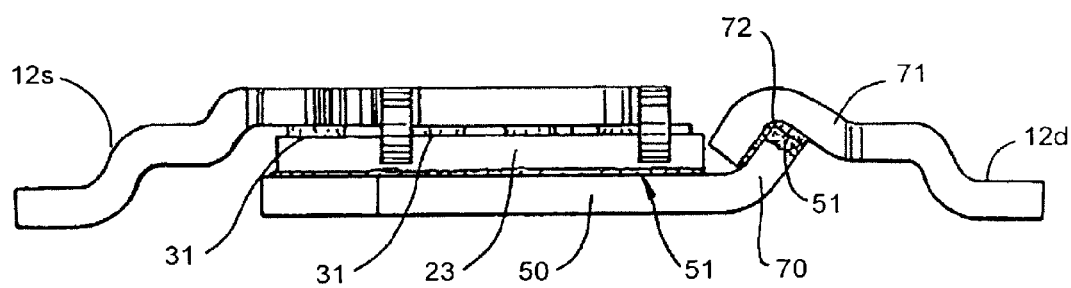
FIG. 4 is a side sectional view of a semiconductor device in accordance with an alternative embodiment of the present invention with the body removed.

As can be seen in FIG. 4, in an alternative embodiment, drain pad 50 may be coupled to a side lip 70. The device includes a lead side rail 71 that includes a v-groove 72. Soft soldering material is once again used to couple the drain pad to the die but in this alternative embodiment, it is also used to couple the side lip to the lead side rail. The soft soldering material couples the side lip to the lead side rail in the v-groove. Thus, leads 12d extending from the lead side rail will serve as the drain connections while source leads 12s will serve as the source connections. A gate lead (not shown) will serve as the gate connection. Window 13 is still preferably provided in that the body so that the drain pad 50 may act as a heatsink.

Finally, tie bars (not shown) may be included that provide extra mechanical support of the source pad. The tie bars also help maintain the source pad coplanarity.

Accordingly, the present invention provides an improved packaging arrangement for semiconductor device that allows for direct connection of the drain region of the die to a printed circuit board (PCB) through a drain clip or drain pad. The drain clip or drain pad also serves as a heatsink for the semiconductor device. No wire bonding is required and the semiconductor device has a lower RDSon performance in comparison to many present day semiconductor devices.

Although the invention has been described with reference to specific exemplary embodiments, it will be appreciated that it is intended to cover all modifications and equivalents within the scope of the appended claims.

What is claimed is:

1. A semiconductor device package comprising:
   a leadframe including a source pad and a gate pad, the leadframe further including a plurality of leads extending from the source pad and at least one lead extending from the gate pad;
   a die coupled to the leadframe;
   a plurality of solder bumps coupling the leadframe to the die;
   a drain pad coupled to a drain region of the die;
   a body including a window defined therein and substantially enveloping the leadframe and die such that a surface of the drain pad opposite the die is exposed through the window; and
   a soft soldering material coupling the drain pad and the drain region of the die,
   wherein the soft soldering material has a melting temperature that is lower than the melting temperature of the solder bumps, and
   wherein the leadframe comprises a free slot in the source pad, wherein the solder bumps coupling the leadframe to the die are between the die and the free slot in the source pad of the leadframe.

2. The semiconductor device package of claim 1 wherein the soft solder material comprises 88PB10Sn2Ag, 85Pb10Sb5Sn, 90Pb10Sb, 82.5Pb15Sn2.5Ag, or a Pb-free solder.

3. The semiconductor device package of claim 1 wherein the leadframe includes a free slot and wherein the body comprises a thermoset polymer.

4. The semiconductor device package of claim 1 wherein the drain pad includes a side lip, and wherein the semiconductor device package further comprises a lead side rail, which includes a v-groove, and wherein the soft solder material is also in the v-groove and couples the lead side rail and the drain pad.

5. The semiconductor device package of claim 1 wherein the solder bump comprises 95Pb/5Sn solder or a Pb-free solder with a melting temperature substantially equal to a melting temperature of 95Pb/5Sn solder.

6. The semiconductor device package of claim 5 wherein the die comprises a power MOSFET.

7. The semiconductor device package of claim 1 wherein the die comprises a power MOSFET.

8. The semiconductor device package of claim 1 wherein the body comprises a thermoset polymer.

9. The semiconductor device package of claim 1 wherein ends of the leads are coplanar with an exposed surface of the drain pad.

10. The semiconductor device package of claim 1 wherein the semiconductor die comprises an underbump material.

11. The semiconductor device package of claim 1 wherein the leadframe comprises a Ni or Ni—Pd plated alloy.

12. The semiconductor device package of claim 1 wherein the die comprises an underbump material comprising TiW, Cu, or Au.

13. The semiconductor device package of claim 1 wherein the drain pad has a thickness of 4–6 mils.

* * * * *